United States Patent [19]

Kaganowicz

[11] 4,168,330
[45] Sep. 18, 1979

[54] METHOD OF DEPOSITING A SILICON OXIDE LAYER

[75] Inventor: Grzegorz Kaganowicz, Princeton, N.J.

[73] Assignee: RCA Corporation, New York, N.Y.

[21] Appl. No.: 841,967

[22] Filed: Oct. 13, 1977

[51] Int. Cl.² .............................................. B05D 3/06
[52] U.S. Cl. ......................................... 427/39; 427/81
[58] Field of Search ....................... 427/38, 39, 79, 81

[56] References Cited

U.S. PATENT DOCUMENTS

| 3,424,661 | 1/1969 | Androshuk et al. | 427/39 |
| 3,473,759 | 10/1969 | Ehinger et al. | 427/39 |

FOREIGN PATENT DOCUMENTS

| 46-46534 | 8/1971 | Japan | 427/39 |

Primary Examiner—John H. Newsome
Attorney, Agent, or Firm—Birgit E. Morris; Allen Bloom

[57] ABSTRACT

This invention pertains to a method of depositing a silicon oxide, such as silicon dioxide, layer on a substrate by utilizing a glow discharge in oxygen and a dielectric precursor having the formula

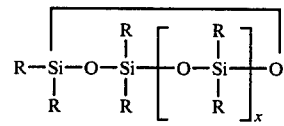

wherein x is an integer of 1 to 4 and each R is independently selected from the group consisting of H, —CH₃, and —C₂H₅.

7 Claims, No Drawings

METHOD OF DEPOSITING A SILICON OXIDE LAYER

REFERENCE TO RELATED APPLICATIONS

This application is related to copending application, "A Method of Depositing a Silicon Oxide Dielectric Layer" by E. B. Priestley and P. J. Call, Ser. No. 793,641, filed May 4, 1977, now abandoned and copending application "Method of Depositing a Lubricant Layer on a Video Disc" by A. D. Grubb and G. F. Nichols, Ser. No. 793,643, filed May 4, 1977, now abandoned which applications are herein incorporated by reference.

BACKGROUND OF THE INVENTION

An audio/video information system for recording and playing back audio/video information has been described in U.S. Pat. Nos. 3,842,194, 3,842,217 and 3,909,517 to Clemens. According to this system, audio and video information and recorded in the form of geometric variations in spiral grooves on the surface of a disc. Disc replicas are then made of an insulating material such as vinyl and are coated first with a conductive film, then with a dielectric film and finally with a lubricant layer. A metallized stylus is utilized as a second electrode forming a capacitor with the video disc. The audio/video information is monitored by the stylus which detects changes in capacitance between the stylus and the video disc as the geometric variations in the form of depressions pass under the stylus.

In the above mentioned copending application to Priestley et al a silicon oxide dielectric layer is deposited on a substrate by evacuating a chamber and introducing into said chamber the substrate, oxygen and a dielectric precursor which has the formula

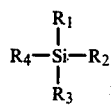

wherein $R_1$ is selected from the group consisting of H or —$CH_3$, $R_2$ and $R_3$ are independently selected from the group consisting of H, —$CH_3$, —$OCH_3$, or —$OC_2H_5$ and $R_4$ is selected from the group consisting of —$OCH_3$ or —$OC_2H_5$. The silicon oxide dielectric layer is deposited onto the conductive surface by activating the precursor around the substrate by means of a glow discharge. The silicon oxide dielectric layers are deposited at high rates with low dielectric precursor pressures in the deposition chamber and the deposited silicon oxide layers do not cause excess wear of either the disc or stylus upon playback.

It has been sought, however, to deposit silicon oxide layers at even higher deposition rates at low dielectric precursor pressures.

SUMMARY OF THE INVENTION

It has been found that silicon oxide layers can be deposited at high rates and low dielectric precursor pressures on a substrate by evacuating a chamber, introducing into the chamber the substrate, oxygen and a dielectric precursor which has the formula

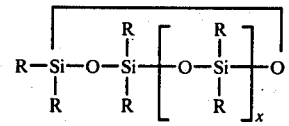

wherein x is an integer of 1 to 4 and each R is independently selected from the group consisting of H, —$CH_3$ and —$C_2H_5$, and activating the dielectric precursor around the substrate.

DETAILED DESCRIPTION OF THE INVENTION

The substrate on which the silicon oxide dielectric layer is deposited may be selected from numerous materials such as metals, alloys, plastics, inorganics, and glass. In an embodiment of this invention the substrate is a conductive material forming a geometrically conformal layer on a vinyl disc surface containing geometrically coded audio/video information. The disc replica is stamped from a suitable material such as vinyl and coated with the conductive layer in accordance with the manner described in the above mentioned Clemens patents and as described in U.S. Pat. No. 3,982,066 to Nyman et al.

Suitably, the coated metal layers consist of either a bilayer consisting of a copper layer and a nickel/chromium/iron alloy layer, or a trilayer consisting of a copper layer, a nickel/chromium/iron alloy layer and a copper layer. The copper layers are approximately 25 to 50 angstroms thick and the nickel/chromium/iron alloy layers are about 100 to 400 angstroms thick.

Next, a layer of a silicon oxide, such as silicon dioxide, is deposited by means of a glow discharge in a vacuum chamber. The silicon oxide layer may be applied using a batch process wherein the discs are introduced into a chamber which is then evacuated and the silicon oxide layer deposited or the silicon oxide layer may be applied utilizing a continuous process wherein discs in a continuous manner are introduced into an evacuated chamber, coated and removed. When a continuous process is used, adjacent interconnecting vacuum chambers may be employed for depositing the prior conductive layer and a subsequent lubricant layer. An apparatus having interconnecting chambers for depositing these layers is described more fully in the above mentioned copending application to E. B. Priestley and P. J. Call.

According to the present invention the deposited silicon oxide layer is formed from oxygen and a dielectric precursor of the formula

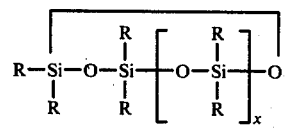

wherein x is an integer of 1 to 4 and each R is independently selected from the group consisting of H, —$CH_3$, and —$C_2H_5$. The oxygen and dielectric precursor must be introduced in sufficient quantities to form dielectric layers from about 50 to 250 angstroms thick at commercially acceptable rates. Suitable silicon oxide deposition rates are greater than about 125 angstroms per minute and preferably greater than about 250 angstroms per minute. While the deposition rate increases with increasing amounts of the precursor in the chamber, the amounts should not be great enough to cause the vacuum to exceed about 12 micrometers of Hg when interconnecting chambers are employed since cross contamination of these chambers may occur.

To prevent the formation of oxygen-deficient films which lack stability, the ratio of the partial pressure of oxygen to the partial pressure of precursor in the chamber must be greater than about 1.5 to 1 and preferably greater than about 2:1. Ratios greater than this do not adversely affect the deposited film, but increase operating pressures unnecessarily.

After the dielectric layer has been deposited, a lubricant layer is deposited in accordance with the manner described in the above mentioned copending application to Grubb et al utilizing for example, a methyl alkyl siloxane lubricant having the formula

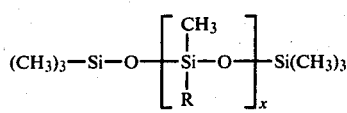

wherein R is an alkyl group of 4–20 carbon atoms and x is an integer. Alternatively, the methyl alkyl siloxane lubricant can be applied by spinning from solution.

The following Examples are presented to further describe the invention but it is not meant to limit the invention to the details described therein.

EXAMPLE 1

A grooved vinyl disc containing video information as in Clemens, 30.5 cm in diameter and coated with a bilayer of a copper layer about 50 angstroms thick and an Inconel (76.8 weight percent Ni, 13.8 weight percent Cr and 8.5 weight percent Fe) layer about 200 angstroms thick, was placed in a 46 cm by 76 cm bell jar. The jar was evacuated to a pressure of $10^{-6}$ torr. 1,3,5,7-tetramethylcyclotetrasiloxane dielectric precursor having the formula

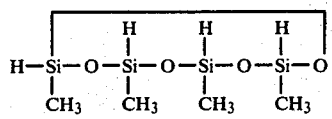

and oxygen were added to the chamber. The precursor's partial pressure was 1 micrometer of Hg and the partial pressure of the oxygen was maintained at about 24 micrometers of Hg. The dielectric layer was deposited by rotating the disc at a rate of 30 rpm between two 8 cm×8 cm electrodes which covered a strip 5.5 cm wide on the disc. To create a glow, 10 kilohertz current was supplied to the electrodes at 300 milliamps.

After the disc was coated with a silicon oxide dielectric layer, the disc was removed from the bell jar. A series of discs were then coated under the same conditions as described above, with the exception that the partial pressure of the dielectric precursor was increased by 1 micrometer of Hg up to 8 micrometers of Hg for each successive coating. The rate of silicon oxide deposition in angstroms per minute versus the precursor's partial pressure is recorded in the Table below.

EXAMPLE 2

In this Example the procedure of Example 1 was substantially followed except that octamethylcyclotetrasiloxane having the formula

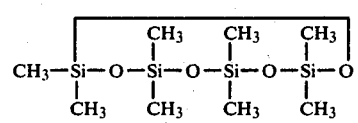

was employed as the dielectric precursor. The results are recorded in the Table below.

CONTROL

This Example is presented as a control. The procedure of Example 1 was substantially followed except that methyl dimethoxysilane was used as the dielectric precursor. Methyl dimethoxysilane is a precursor described in the above mentioned copending application to Priestley et al. The results are recorded in the Table below.

TABLE

| Dielectric Precursor Pressure | Example 1 | Example 2 | Control |
|---|---|---|---|
| 1 micrometer of Hg | 108 angstroms/min. | 192 angstroms/min. | 96 angstroms/min. |
| 2 micrometer of Hg | 210 angstroms/min. | — | 150 angstroms/min. |
| 3 micrometer of Hg | 468 angstroms/min. | 264 angstroms/min. | 150 angstroms/min. |
| 4 micrometer of Hg | 702 angstroms/min. | 360 angstroms/min. | 228 angstroms/min. |
| 5 micrometer of Hg | 888 angstroms/min. | 390 angstroms/min. | 264 angstroms/min. |
| 6 micrometer of Hg | 918 angstroms/min. | 480 angstroms/min. | — |
| 7 micrometer of Hg | 1056 angstroms/min. | 510 angstroms/min. | — |
| 8 micrometer of Hg | 1170 angstroms/min. | — | 408 angstroms/min. |

What is claimed is:

1. In a method of depositing a silicon oxide layer on a substrate comprising evacuating a chamber, introducing the substrate into the chamber, introducing oxygen and a dielectric precursor into the chamber, and activating the precursor around the substrate by means of a glow discharge whereby a silicon oxide dielectric layer is deposited wherein the improvement comprises employing as the dielectric precursor a compound which has the formula

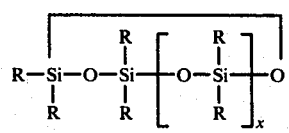

wherein x is an integer of 1 to 4 and each R is independently selected from the group consisting of H, —CH₃ and $-C_2H_5$ and employing a dielectric precursor partial pressure of below 12 micrometers of Hg.

2. A method according to claim 1 wherein the silicon oxide is silicon dioxide.

3. A method according to claim 1 wherein the substrate has a conductive surface.

4. A method according to claim 1 wherein the ratio of the partial pressure of the oxygen to the partial pressure of the precursor in the chamber is greater than about 1.5 to 1.

5. A method according to claim 1 wherein the ratio of the partial pressure of the oxygen to the partial pressure of the precursor is greater than about 2 to 1.

6. A method according to claim 1 wherein the dielectric precursor is selected from the group consisting of 1,3,5,7-tetramethylcyclotetra siloxane and octamethylcyclotetra siloxane.

7. A method according to claim 1 wherein the deposited silicon oxide film is from about 50 to about 250 angstroms thick.

* * * * *